(12) United States Patent
Wu et al.

(10) Patent No.: US 7,526,701 B2
(45) Date of Patent: Apr. 28, 2009

(54) METHOD AND APPARATUS FOR MEASURING GROUP DELAY OF A DEVICE UNDER TEST

(75) Inventors: Ching-san Wu, Hsin-Chu (TW); Chien-ming Chen, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 357 days.

(21) Appl. No.: 11/351,734

(22) Filed: Feb. 10, 2006

(65) Prior Publication Data

US 2006/0156147 A1    Jul. 13, 2006

Related U.S. Application Data

(63) Continuation-in-part of application No. 10/262,746, filed on Oct. 2, 2002, now Pat. No. 7,032,150.

(51) Int. Cl.
  *G01R 31/28* (2006.01)
(52) U.S. Cl. .................. 714/734; 714/700; 714/742
(58) Field of Classification Search ................ 324/622, 324/621, 613; 347/18; 702/77; 356/477; 714/700, 734, 742
  See application file for complete search history.

(56) References Cited

U.S. PATENT DOCUMENTS

| | | | |
|---|---|---|---|
| 2,877,409 A * | 3/1959 | Jacobsen et al. ............ 324/622 |
| 3,414,809 A * | 12/1968 | Coenning et al. ........... 324/621 |
| 3,629,696 A * | 12/1971 | Bartelink .................... 370/215 |
| 3,968,427 A | 7/1976 | Sharrit |
| 3,970,926 A * | 7/1976 | Rigby et al. ................. 324/621 |
| 4,244,054 A * | 1/1981 | Lorea ....................... 455/115.2 |
| 4,451,782 A | 5/1984 | Ashida |
| 5,157,652 A | 10/1992 | Walker |
| 5,166,641 A | 11/1992 | Davis et al. |
| 5,179,344 A | 1/1993 | Najle et al. |
| 5,231,598 A | 7/1993 | Vlahos |
| 5,831,423 A | 11/1998 | Mancini |
| 5,875,213 A | 2/1999 | Asami et al. |
| 6,038,427 A * | 3/2000 | Hsu et al. .................... 455/12.1 |
| 6,208,946 B1 | 3/2001 | Arakawa et al. |
| 6,486,961 B1 | 11/2002 | Szfraniec et al. |
| 6,505,312 B1 | 1/2003 | Takeuchi et al. |

* cited by examiner

*Primary Examiner*—David Ton

(57) ABSTRACT

A method of measuring group delay of a device under test is provided. The method includes the steps of providing an analog input signal with a predetermined period to the device under test to obtain a delayed output signal from the device under test, converting the analog input signal and the delayed output signal into first and second digital signals, generating a phase difference signal indicative of a phase difference between the first and the second digital signals, and determining the group delay of the device under test based on the predetermined period and average signal level of the phase difference voltage and average signal level of the first digital signal.

28 Claims, 6 Drawing Sheets

METHOD AND APPARATUS FOR MEASURING GROUP DELAY OF A DEVICE UNDER TEST

CROSS REFERENCE TO RELATED APPLICATION

This is a continuation-in-part of a U.S. patent application Ser. No. 10/262,746 filed on Oct. 2, 2002, U.S. Pat. No. 7,032,150.

BACKGROUND OF THE INVENTION

1. Field of the Invention

The present invention relates to a method and apparatus for measuring group delay of a device under test, more particularly, to a method and apparatus for measuring group delay of a device under test that utilize a single-tone analog input signal.

2. Description of the Related Art

Group delay of most electronic devices will result in non-negligible influences. For example, in a data storage system, if group delay of an internal electronic device of the data storage system cannot be managed, correct timing sequence during data reproduction cannot be ensured, which can result in incorrect decoding of data. Furthermore, for digital communication systems, if group delay cannot be properly processed, non-linear distortion of transmission signals cannot be avoided. As such, measurement of group delay of an electronic device is very important.

In a conventional method of measuring group delay ($T_{gd}$) of a device under test having a high cut-off frequency band, a multi-tone signal, which is a high frequency signal, is provided to the device under test. As shown in FIG. 1, the multi-tone signal, which is provided from a multi-tone input source, includes two high frequency components 11 & 12. There exists a frequency difference ($\Delta f$) between the high frequency components 11 and 12. For example, the high frequency components 12, 11 may be 40 MHz and 40.05 MHz, respectively. A phase difference ($\Delta P$) between the high frequency components 11, 12 can be calculated by discrete Fourier transform using relevant analysis instruments after passing the device under test (DUT). As such, the group delay ($T_{gd}$) equal to $-\Delta P/\Delta f$ may be obtained accordingly.

However, in order to obtain a precise measurement, the analysis instruments used in the aforesaid method must include a high-speed digitizer for high-speed digitizing of the high frequency components 11, 12, and a high-resolution measuring device for calculating the phase difference ($\Delta P$). Unfortunately, the high-speed digitizer and the high-resolution measuring device are very expensive and use of the same results in high costs.

SUMMARY OF THE INVENTION

Therefore, the objective of the present invention is to provide a method and apparatus for measuring group delay of a device under test at a relatively low cost.

According to one aspect of the present invention, a method of measuring group delay ($T_{gd}$) of a device under test, comprising the steps of:

(a) providing an analog input signal with a predetermined period (T) to the device under test to obtain a delayed output signal from the device under test;

(b) converting the analog input signal and the delayed output signal into first and second digital signals, respectively;

(c) generating a phase difference signal indicative of a phase difference between the first and the second digital signals; and (d) determining the group delay ($T_{gd}$) of the device under test based on the predetermined period and average signal levels of the phase difference voltage and the first digital signal.

According to another aspect of the present invention, a method of measuring group delay ($T_{gd}$) of a device under test, comprising the steps of:

(a) providing an analog input signal having a predetermined period;

(b) converting the analog input signal into first and second calibrating digital signals;

(c) generating a calibrating phase difference signal indicative of a phase difference between the first and the second calibrating digital signals;

(d) providing the analog input signal to the device under test to obtain a delayed output signal from the device under test;

(e) converting the analog input signal and the delayed output signal into first and second measuring digital signals, respectively;

(f) generating a measuring phase difference signal indicative of a phase difference between the first and the second measuring digital signals; and (g) determining the group delay ($T_{gd}$) of the device under test based on the predetermined period, average signal level of the calibrating phase difference signal, average signal level of the measuring phase difference signal, average signal level of the first measuring digital signal, and average signal level of the first calibrating digital signal.

According to still another aspect of the present invention, an apparatus for measuring group delay ($T_{gd}$) of a device under test that has input and output ends, the apparatus includes a signal source, a first analog-to-digital converter, a second analog-to-digital converter, a phase detector, a average voltage calculator, and a decision unit. The signal source, coupled to the input end of the device under test, provides an analog input signal having a predetermined period (T) to the input end of the device under test, thereby enabling the device under test to generate a delayed output signal at the output end thereof. The first analog-to-digital converter, coupled to the signal source, converts the analog input signal into a first digital signal. The second analog-to-digital converter, coupled to the output end of the device under test, converts the delayed output signal into a second digital signal. The phase detector, coupled to the first and second analog-to-digital converters, generates a phase difference signal between the first and second digital signals. The average unit is for calculating average signal level of the first digital signal and average voltage of the phase difference signal. The decision unit determines the group delay ($T_{gd}$) of the device under test according to the predetermined period, the average voltage of the first digital signal and average voltage of the phase difference signal.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
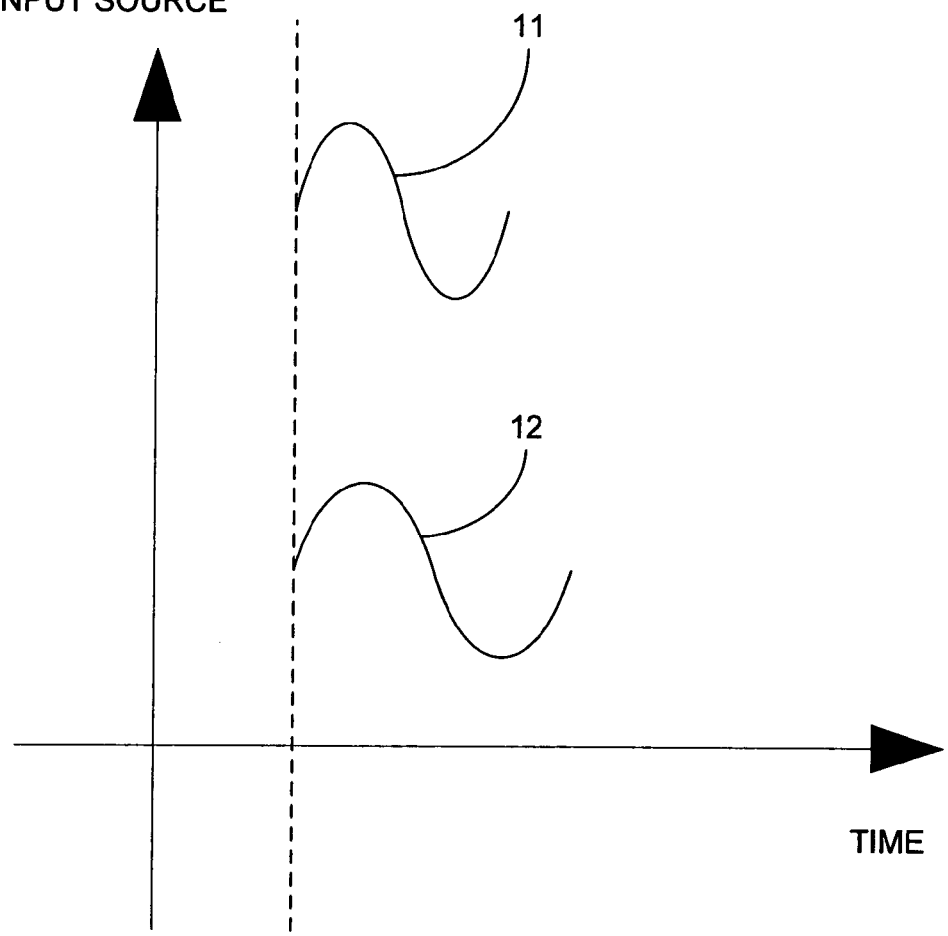
FIG. 1 illustrates two frequency components of a multi-tone signal used in a conventional method of measuring group delay.
Figure 2:
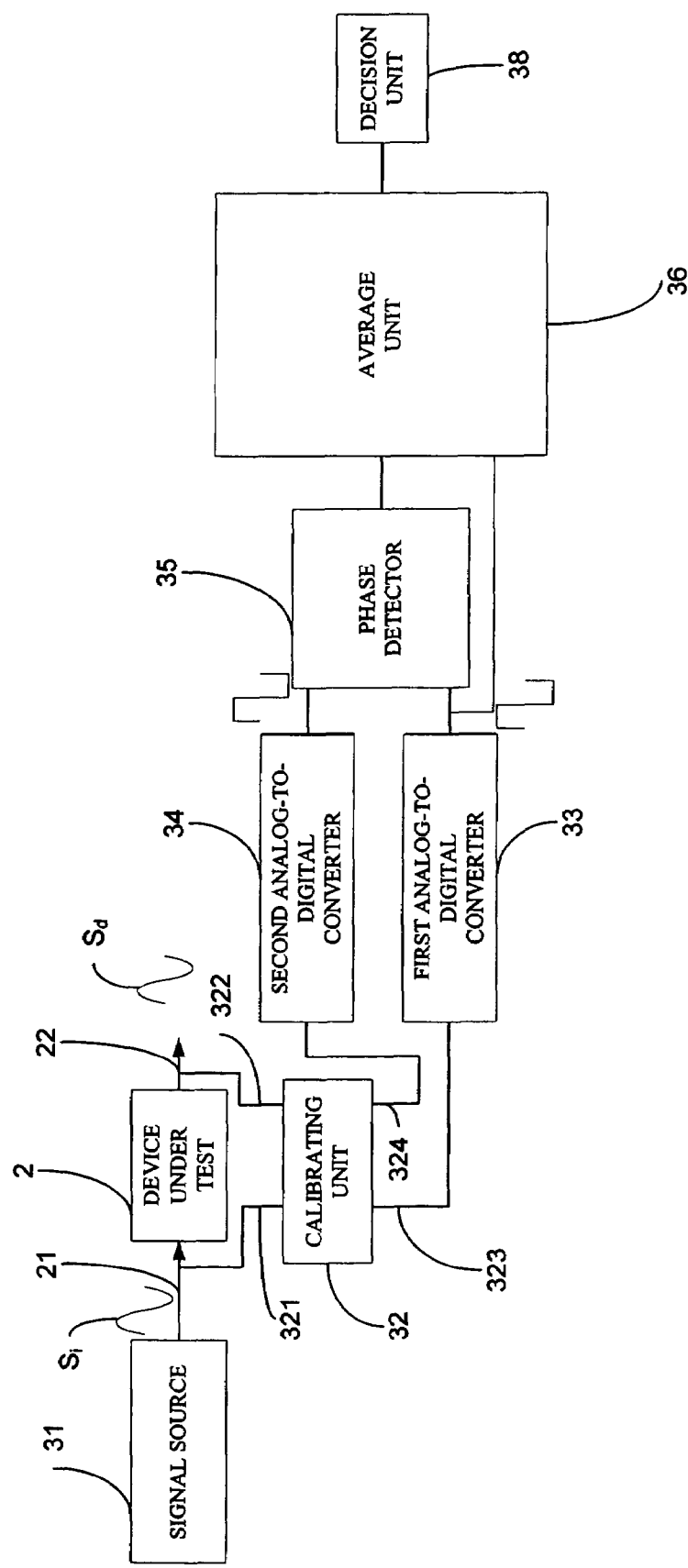
FIG. 2 is a schematic circuit block diagram illustrating the preferred embodiment of an apparatus for measuring group delay of a device under test.

Referring to FIG. 2, the preferred embodiment of an apparatus for measuring group delay ($T_{gd}$) of a device under test 2 according to the present invention is shown to include a signal source 31, a calibrating unit 32, a first analog-to-digital converter 33, a second analog-to-digital converter 34, a phase detector 35, an average unit 36, and a decision unit 38. The device under test 2 has input and output ends 21, 22.

The signal source 31 is adapted to be connected to the input end 21 of the device under test so as to provide an analog input signal ($S_i$), which is a single-tone signal, having a predetermined period (T) to the input end 21 of the device under test 2, thereby enabling the device under test 2 to generate a delayed output signal ($S_d$) at the output end 22 thereof. In this embodiment, the analog input signal ($S_i$) provided by the signal source 31 is a sinusoidal wave signal.

The calibrating unit 32 has a first input 321 coupled to the input end 21 of the device under test 2, a second input 322 adapted to be connected to the output end 22 of the device under test 2, and first and second outputs 323, 324. The calibrating unit 32 is operable in a selected one of a calibrating mode and a measuring mode. In this embodiment, the calibrating unit 32 is a multiplexer. Such that, while operated in the calibrating mode, the calibrating unit 32 is multiplexed to output the analog input signal ($S_i$) simultaneously at the first and second outputs 323, 324. While operated in the measuring mode (see FIG. 3), the calibrating unit 32 is multiplexed to output the analog input signal ($S_i$) and the delayed output signal ($S_d$) at the first and second outputs 323, 324, respectively.

Figure 3:
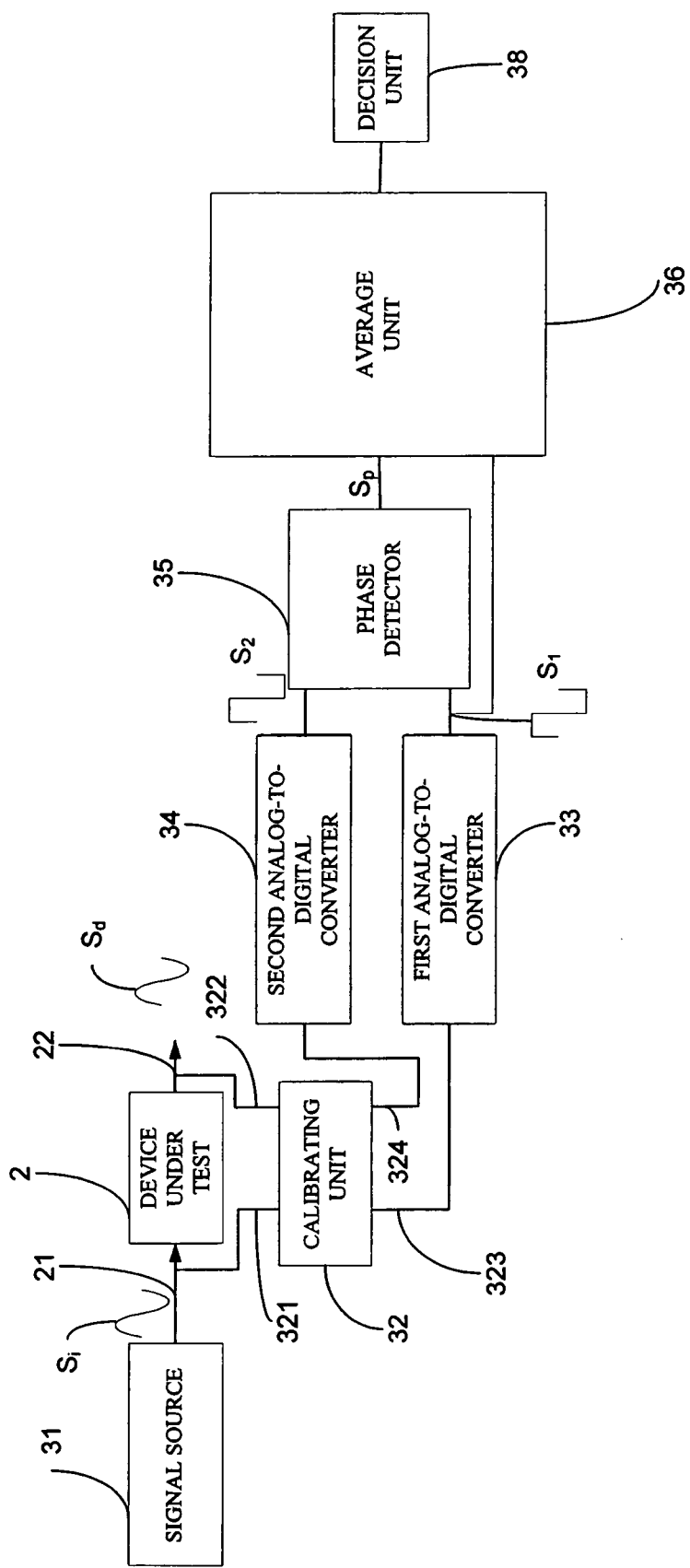
FIG. 3 shows a schematic circuit block diagram illustrating the preferred embodiment when the calibrating unit operates in a measuring mode.
Figure 4:
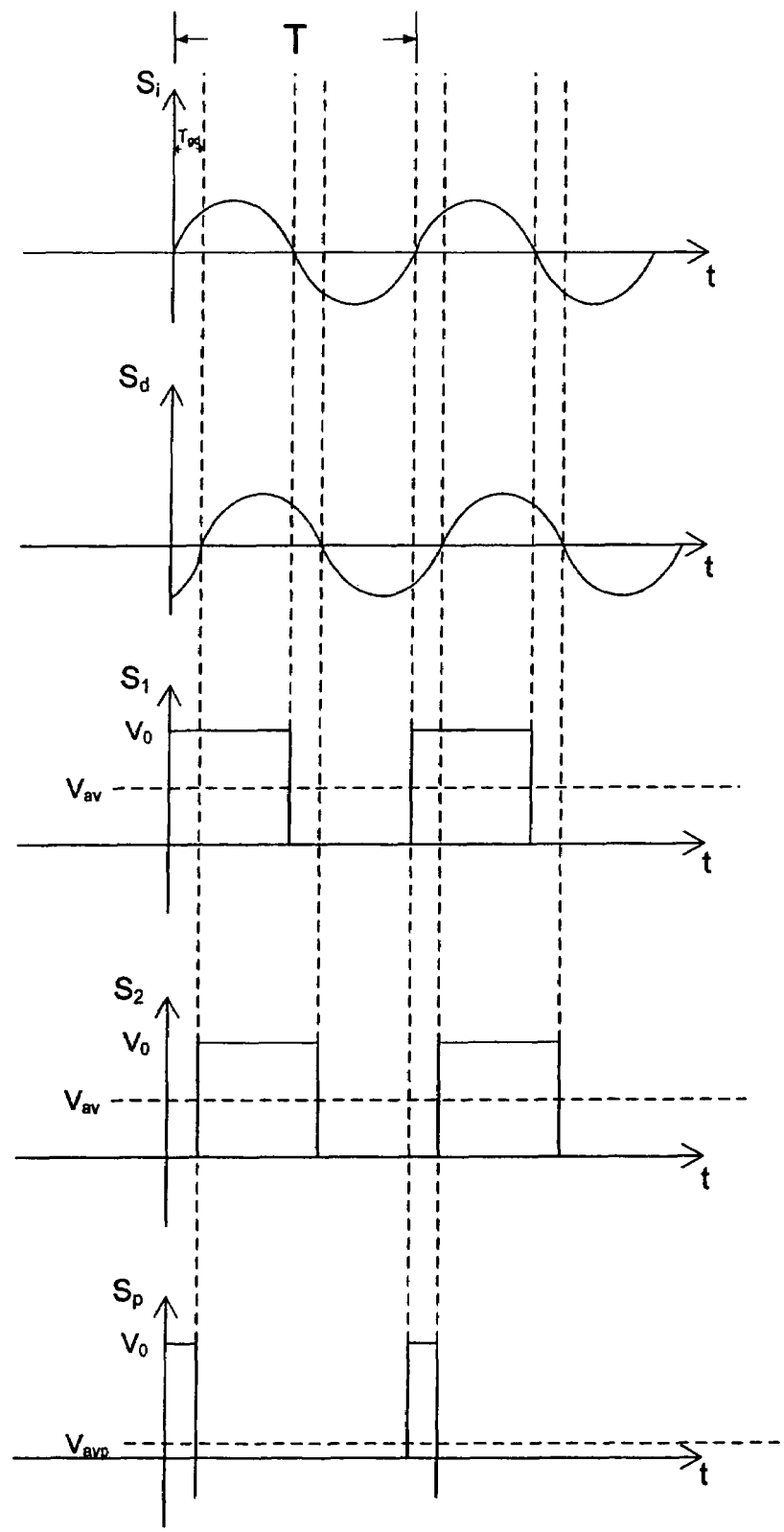
FIG. 4 shows waveforms of various signals as the circuitry of FIG. 3 is operated in the measuring mode.

Please refer to FIG. 3 and FIG. 4. FIG. 3 shows a schematic circuit block diagram illustrating the preferred embodiment when the calibrating unit operates in a measuring mode. FIG. 4 shows waveform of various signals as the circuitry of FIG. 3 is operated in the measuring mode. The first analog-to-digital converter 33 is connected to the first output 323 of the calibrating unit 32, and the second analog-to-digital converter 34 is connected to the second output 324 of the calibrating unit 32. When the calibrating unit 32 is operated in the measuring mode, the first analog-to-digital converter 33 receives the analog input signal ($S_i$) from the first output 323 of the calibrating unit 32, and converts the analog input signal ($S_i$) into a first digital signal ($S_1$), while the second analog-to-digital converter 34 receives the delayed output signal ($S_d$) from the second output 324 of the calibrating unit 32, and converts the delayed output signal ($S_d$) into a second digital signal ($S_2$) (as shown in FIG. 4).

In one embodiment of the present invention, the first analog-to-digital converter 33 and the second analog-to-digital converter 34 are implemented as slicers for slicing the input signals of the analog-to-digital converter 33 and analog-to-digital converter 34 into rectangular wave.

The phase detector 35, coupled to the first and second analog-to-digital converters 33, 34, receives the first and second digital signals ($S_1$, $S_2$) from the first and second analog-to-digital converters 33, 34, detects and measures phase difference between the first and second digital signals ($S_1$, $S_2$) (see FIG. 4) to accordingly generate a measuring phase difference signal ($S_p$). Then, the average unit 36 calculates an average signal level of the measuring phase difference signal $S_p$, and an average signal level of the first digital signal $S_1$. As illustrated in FIG. 4, the average signal level of the first digital signal $S_1$, which is an average voltage $V_{av}$, equals to $\frac{1}{2} * V_0 * T/T$, where $V_0$ is a high voltage level of the first digital signal. The average signal level of the measuring phase difference signal $S_p$, which is an average voltage $V_{avp}$, equals to $T_{gd} * V_0 / T$. In one embodiment of the present invention, the average unit 36 is a low-pass filter which averages the signal levels by low-pass filtering the voltage levels of the measuring phase difference signal and the first digital signal. Therefore, the decision unit 38 determines the group delay ($T_{gd}$) of the device under test 2 which is concluded as an equation of $T_{gd} = \frac{1}{2} * T * (V_{avp}/V_{av})$, where the period (T) of the analog input signal is known.

Figure 5:
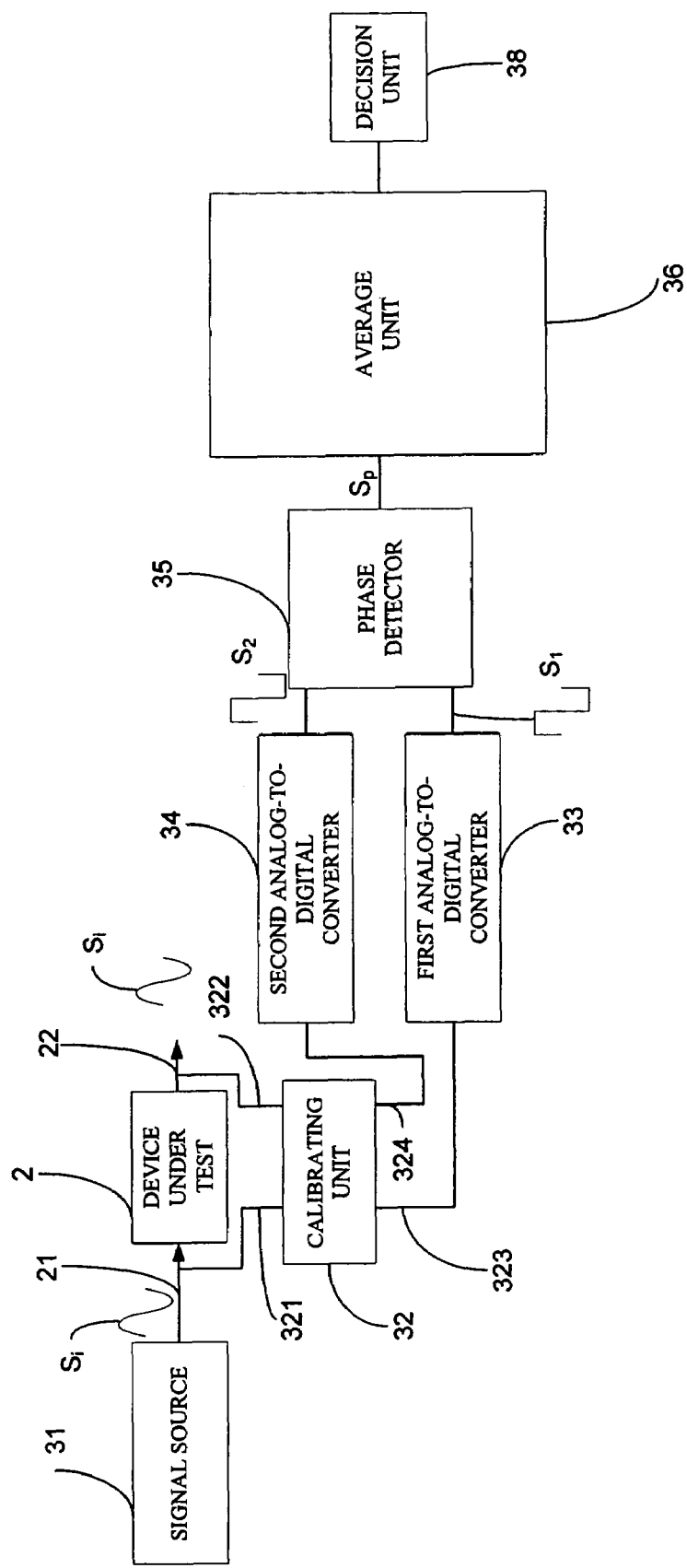
FIG. 5 illustrates the schematic diagram of one another embodiment of the present invention.

Please refer to FIG. 5, the schematic diagram of one another embodiment of the present invention. In this case of the embodiment, the high level voltage $V_0$ of the first digital signal is predetermined as a known value. Such that, the group delay ($T_{gd}$) could be obtained according to the average signal level of the measuring phase difference and the predetermined voltage level $V_0$. While the average unit 36 obtains the average signal level of the measuring phase difference signal by calculating an average voltage $V_{avp}$ of the measuring phase difference signal, the decision unit 38 also determines the group delay $T_{gd}$ by the relationship of $T_{gd} = V_{avp} * T/V_0$.

Figure 6:
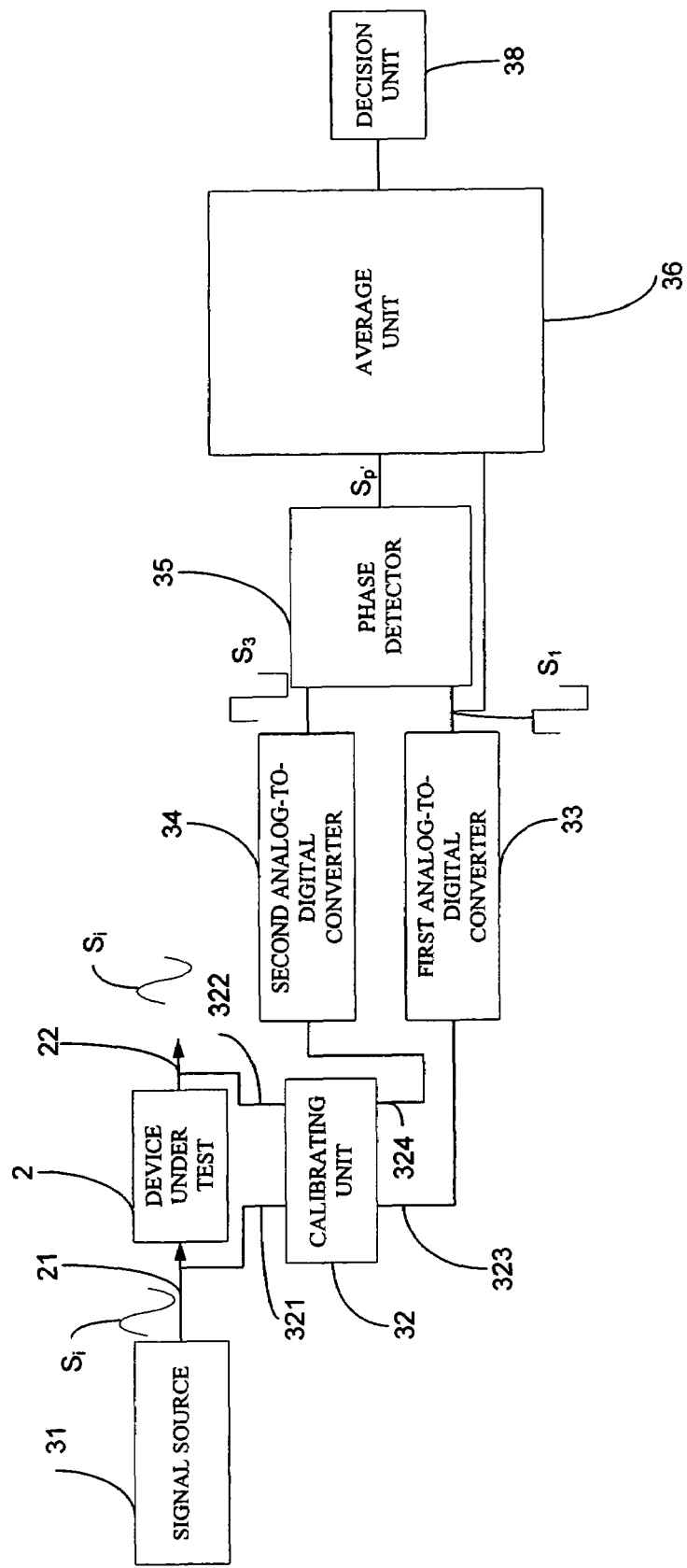
FIG. 6 is a schematic circuit block diagram illustrating the preferred embodiment when the calibrating unit operates in a calibrating mode.

It is noted that, in an ideal condition (i.e., the effect of the device mismatch of the present invention is limited), a group delay difference $\Delta T_{gd}$ occurred between the path of calibrating unit 32, through the first analog-to-digital 33 and the path of calibrating unit 32, through the second analog-to-digital 34 is substantially eliminated. Such that, the group delay ($T_{gd}$) can be simplified to equal to $T_{gd} = \frac{1}{2} * T * (V_{avp}/V_{av})$. However, for real circuitry, calibration of the group delay difference $\Delta T_{gd}$ is required in order to obtain precise group delay. In this case, a calibrating phase difference signal is generated for calibrating the group delay difference $\Delta T_{gd}$. Referring to FIG. 6, when the calibrating unit 32 is operated in the calibrating mode, the first analog-to-digital converter 33 receives the analog input signal ($S_i$) from the first output 323 of the calibrating unit 32, and converts the analog input signal ($S_i$) into a first digital signal ($S_1$). The second analog-to-digital converter 34 is connected to the second output 324 of the calibrating unit 32. The second analog-to-digital converter 34 receives the analog input signal ($S_i$) from the second output 324 of the calibrating unit 32, and converts the analog input signal ($S_i$) into a third digital signal ($S_3$). The phase detector 35, coupled to the first and second analog-to-digital converters 33, 34, receives the first and second digital calibrating signals ($S_1$, $S_3$) from the first and second analog-to-digital converters 33, 34, detects and measures phase difference between the first and second digital calibrating signals ($S_1$, $S_3$) to accordingly generate the calibrating phase difference signal ($S_{p'}$).

Similarly, the average unit 36 calculates an average voltage of the calibrating phase difference signal $S_{p'}$ (i.e. $V_{avp'}$) and an average voltage of the first digital signal $S_i$ (i.e. $V_{av}$). Thus the decision unit 38 can determine the group delay difference $\Delta T_{gd}$ of the path from the calibrating unit 32 to the phase detector 35. In this manner, the precise group delay is concluded as:

$$T_{gd}=\frac{1}{2}*T*(V_{avp}/V_{av})-\Delta T_{gd}=\frac{1}{2}*T*(V_{avp}/V_{av})-\frac{1}{2}*T*(V_{avp}'/V_{av}).$$

In summary, the preferred embodiment uses the phase detector 35 so as to obtain the phase difference signal ($S_p$) between the first and second digital signals ($S_1$, $S_2$) converted from the analog input signal ($S_i$) and the delayed output signal ($S_d$). Finally, by simply using the relationship between period (T) of the analog input signal, average voltage of the phase difference signal ($S_p$), and the average voltage of the first digital signal $S_1$ (or the average voltage of the second digital signal $S_2$ having the same period T), a precise group delay can be obtained. Therefore, there is no need to calculate the phase difference occurred between different frequency components of the output multi-tone signals, such that the expensive high-speed digitizer and high-resolution measuring device used in the prior art can be eliminated, thereby resulting in lower costs. The objective of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method of measuring group delay ($T_{gd}$) of a device under test, comprising the steps of:
   (a) providing an analog input signal with a predetermined period (T) to the device under test to obtain a delayed output signal from the device under test;
   (b) converting the analog input signal and the delayed output signal into first and second digital signals, respectively;
   (c) generating a measuring phase difference signal indicative of a phase difference between the first and the second digital signals; and
   (d) determining the group delay ($T_{gd}$) of the device under test based on the predetermined period (T) and an average signal level of the measuring phase difference signal.

2. The method of claim 1 wherein the analog input signal is a sinusoidal wave signal.

3. The method of claim 1, wherein each of the first and second digital signals is a square wave signal.

4. The method of claim 1, wherein step (b) converting the analog input signal and the delayed output signal, performed by slicing, respectively, the analog input signal and the delayed output signal.

5. The method of claim 1, wherein step (d), an average voltage ($V_{avp}$) of the measuring phase difference signal is provided as the average signal level of the measuring phase difference signal.

6. The method of claim 5, wherein the high level voltage of the first digital signal is predetermined as $V_0$, and in step (d), the group delay ($T_{gd}$) is determined based on a function of $T_{gd}=V_{avp}*T/V_0$.

7. The method of claim 1, wherein step (d) further comprises low-pass filtering the measuring phase difference signal to obtain the average signal level of the measuring phase difference signal.

8. The method of claim 1, wherein step (d) further comprises determining the group delay ($T_{gd}$) of the device under test based on the predetermined period, the average signal level of the measuring phase difference signal, and the average signal level of the first digital signal.

9. The method of claim 8, wherein step (d) further comprises low-pass filtering the first digital signal to obtain the average signal level of the first digital signal.

10. The method of claim 8, wherein step (d), an average voltage ($V_{avp}$) of the measuring phase difference signal is provided as the average signal level of the measuring phase difference signal, and an average voltage ($V_{av}$) of the first digital signal is provided as the average signal level of the first digital signal.

11. The method of claim 10, wherein step (d), the group delay ($T_{gd}$) is determined based on a function of $T_{gd}=\frac{1}{2}*T*(V_{avp}/V_{av})$.

12. The method of claim 1, further comprising the steps of:
   (e) converting the analog input signal into third digital signal;
   (f) generating a calibrating phase difference signal indicating the phase difference between the first and the third digital signals;
   wherein step (d) further comprising determining the group delay ($T_{gd}$) of the device under test based on the predetermined period, an average signal level of the calibrating phase difference signal, the average signal level of the measuring phase difference signal.

13. The method of claim 12, wherein step (d), an average voltage ($V_{avp}$) of the measuring phase difference signal is provided as the average signal level of the measuring phase difference signal, an average voltage ($V_{avp}'$) of the calibrating phase difference signal is provided as the average signal level of the calibrating phase difference signal, the high level voltage of the first digital signal is predetermined as $V_0$, and the group delay ($T_{gd}$) is determined based on a function of $T_{gd}=V_{avp}*T/V_0-V_{avp}'*T/V_0$.

14. The method of claim 12, wherein step (d), an average voltage ($V_{avp}$) of the measuring phase difference signal is provided as the average signal level of the measuring phase difference signal; an average voltage ($V_{avp}'$) of the calibrating phase difference signal is provided as the average signal level of the calibrating phase difference signal; an average voltage $V_{av}$ is provided as the average signal level of the first digital signal; and the group delay ($T_{gd}$) is determined based on a function of: $T_{gd}=\frac{1}{2}*T*(V_{avp}/V_{av})-\frac{1}{2}*T*(V_{avp}'/V_{av})$.

15. An apparatus for measuring group delay ($T_{gd}$) of a device under test that has input and output ends, the apparatus comprising:
   a signal source coupled to the input end of the device under test to provide an analog input signal having a predetermined period (T) of the input end of the device under test, thereby enabling the device under test to generate a delayed output signal at the output end thereof;
   a first analog-to-digital converter coupled to the signal source for converting the analog input signal into a first digital signal;
   a second analog-to-digital converter coupled to the output end of the device under test for converting the delayed output signal into a second digital signal;
   a phase detector coupled to the first and second analog-to-digital converters for generating a phase difference signal indicating the phase difference between the first and second digital signals;
   an average unit for calculating an average signal level of the phase difference signal; and
   a decision unit for determining the group delay ($T_{gd}$) of the device under test according to the predetermined period and the average signal level of the phase difference signal.

16. The apparatus of claim 15, wherein the analog input signal provided by the signal source is a sinusoidal wave signal.

17. The apparatus of claim 15, wherein each of the first analog-to-digital converter and the second analog-to-digital converter is a slicer.

18. The apparatus of claim 15, wherein the average unit calculates an average voltage ($V_{avp}$) of the phase difference signal to serve as the average signal level of the phase difference signal.

19. The apparatus of claim 18, wherein the high level voltage of the first digital signal is predetermined as $V_0$, and the decision unit determines the group delay ($T_{gd}$) based on a function of $T_{gd}=V_{avp}*T/V_0$.

20. The apparatus of claim 15, wherein the average unit further calculates an average signal level of the first digital signal, and the decision unit determines the group delay ($T_{gd}$) according to the average signal level of the phase difference signal and the average signal level of the first digital signal.

21. The apparatus of claim 20, wherein the average unit calculates an average voltage ($V_{avp}$) of the phase difference signal to serve as the average signal level of the phase difference signal and calculates an average voltage ($V_{av}$) of the first digital signal to serve as the average signal level of the first digital signal.

22. The apparatus of claim 21, wherein the decision unit determines the group delay ($T_{gd}$) based on a function of $T_{gd}=½*T*(V_{avp}/V_{av})$.

23. The apparatus of claim 15, wherein the average unit comprising a low-pass filter for calculating the average signal level of the phase difference signal.

24. The apparatus of claim 15, further comprising a calibrating unit having a first input connected to the input end of the device under test, a second input connected to the output end of the device under test, a first output connected to the first analog-to-digital converter, and a second output connected to the second analog-to-digital converter, wherein the calibrating unit provides the analog input signal and the delayed output signal to the first and second analog-to-digital converters, respectively, as operated in the measuring mode, the calibrating unit provides the analog input signals simultaneously to the first and second analog-to-digital converters, as operated in the calibrating mode.

25. The apparatus of claim 24, wherein the phase detector generates the phase difference signal to serve as a measuring phase difference signal while the calibrating unit operates in the measuring mode; the phase detector generates the phase difference signal to serve as a calibrating phase difference signal while the calibrating unit operates in the calibrating mode; and the decision unit determines the group delay ($T_{gd}$) of the device under test according to the predetermined period, an average signal level of the measuring phase difference signal and an average signal level of the calibrating phase difference signal.

26. The apparatus of claim 25, wherein the average unit calculates an average voltage ($V_{avp}$) of the measuring phase difference signal to serve as the average signal level of the measuring phase difference signal and calculates an average voltage ($V_{avp}'$) of the calibrating phase difference signal to served as the average signal level of the calibrating phase difference signal; the high level voltage of the first digital signal is predetermined as $V_0$, and the decision unit determines the group delay ($T_{gd}$) based on a function of $T_{gd}=V_{avp}*T/V_0-V_{avp}'*T/V_0$.

27. The apparatus of claim 25, wherein the average unit further calculates an average signal level of the first digital signal, and the decision unit determines the group delay ($T_{gd}$) according to the predetermined period, and an average signal level of the measuring phase difference signal and an average signal level of the calibrating phase difference signal and the average signal level of the first digital signal.

28. The apparatus of claim 27, wherein the average unit calculates an average voltage ($V_{avp}$) of the measuring phase difference signal to serve as the average signal level of the measuring phase difference signal and calculates an average voltage ($V_{avp}'$) of the calibrating phase difference signal to serve as the average signal level of the calibrating phase difference signal and calculates an average voltage ($V_{av}$) of the first digital signal to serve as the average signal level of the first digital signal, and the decision unit determines the group delay ($T_{gd}$) based on a function of $T_{gd}=½*T*(V_{avp}/V_{av})-½*T*(V_{avp}'/V_{av})$.

* * * * *